(12) United States Patent
Lee et al.

(10) Patent No.: US 7,910,232 B2
(45) Date of Patent: Mar. 22, 2011

(54) INFORMATION STORAGE DEVICES USING MAGNETIC DOMAIN WALL MOVEMENT AND METHODS OF MANUFACTURING THE SAME

(75) Inventors: Sung-chul Lee, Osan-si (KR); Sun-ae Seo, Hwaseong-si (KR); Young-jin Cho, Suwon-si (KR); Chang-won Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 137 days.

(21) Appl. No.: 12/149,641

(22) Filed: May 6, 2008

(65) Prior Publication Data
US 2009/0130492 A1    May 21, 2009

(30) Foreign Application Priority Data

Nov. 15, 2007   (KR) ........................ 10-2007-0116768

(51) Int. Cl.
*G11B 5/76* (2006.01)

(52) U.S. Cl. .......... 428/832; 365/87; 365/171; 365/173; 365/81

(58) Field of Classification Search .................. None
See application file for complete search history.

(56) References Cited

U.S. PATENT DOCUMENTS

| 6,864,042 | B1 * | 3/2005 | Kuo et al. | 430/320 |
| 2005/0220990 | A1 * | 10/2005 | Aoyama et al. | 427/127 |
| 2006/0177700 | A1 * | 8/2006 | Fullerton et al. | 428/828 |
| 2008/0165576 | A1 * | 7/2008 | Deligianni et al. | 365/171 |

* cited by examiner

*Primary Examiner* — Holly Rickman
(74) *Attorney, Agent, or Firm* — Harness, Dickey & Pierce, PLC

(57) ABSTRACT

Information storage devices and methods of manufacturing the same are provided. An information storage device includes a magnetic layer formed on an underlayer. The underlayer has at least one first region and at least one second region. The first and second regions have different crystallinity characteristics. The magnetic layer has at least one third region formed on the at least one first region and at least one fourth region formed on the at least one second region. The third and fourth regions have different magnetic anisotropic energy constants.

13 Claims, 3 Drawing Sheets

INFORMATION STORAGE DEVICES USING MAGNETIC DOMAIN WALL MOVEMENT AND METHODS OF MANUFACTURING THE SAME

PRIORITY STATEMENT

This application claims priority under 35 U.S.C. §119 to Korean Patent Application No. 10-2007-0116768, filed on Nov. 15, 2007, in the Korean Intellectual Property Office, the entire contents of which is incorporated herein by reference.

BACKGROUND

Description of the Related Art

Conventional non-volatile information storage devices, such as a hard disk drive (HDD) or a nonvolatile random access memory (RAM), retain recorded information even when power is cut-off.

Conventional HDDs store information using a rotating part, which may wear down over time. This wear results in a higher likelihood of operational failure, which reduces reliability.

An example of a conventional non-volatile RAM is a flash memory. Although conventional flash memories do not include rotating part, they have relatively slow reading and writing speeds, relatively short life spans, and relatively small storage capacities when compared to conventional HDDS. In addition, conventional flash memories have relatively high manufacturing costs.

Another type of non-volatile information storage device uses principles of magnetic domain wall movement of a magnetic material. In these information storage devices, a minute magnetic region (e.g., a ferromagnetic substance) is referred to as a magnetic domain. A boundary portion between each of the magnetic domains having different magnetization directions is referred to as a magnetic domain wall. Magnetic domain walls have a given volume and may be moved by a current or an external magnetic field applied to a magnetic layer.

To implement information storage devices using magnetic domains and magnetic domain wall movement, the stability of bit-unit movement of a magnetic domain wall must be secured. Conventionally, a geometrical pinning site such as a notch in a magnetic layer has been used to secure the bit-unit movement of the magnetic domain wall. However, this method is relatively complex and recording density is relatively limited.

SUMMARY

Example embodiments relate to information storage devices and methods of manufacturing the same. For example, at least one example embodiment provides an information storage device using magnetic domain wall movement and a method of manufacturing the same.

At least one example embodiment provides an information storage device using magnetic domain wall movement. According to at least this example embodiment, a current applying unit may be connected to a magnetic layer. The magnetic layer may have a plurality of magnetic domains. The magnetic layer may be formed on an underlayer. The underlayer may include first and second regions. The first and second regions may have different crystalline characteristics and may be disposed alternately. The magnetic layer may include a third region formed on the first region and a fourth region formed on the second region. The third and fourth regions may have different magnetic anisotropic energy constants.

According to at least some example embodiments, one of the first and second regions may be a doped (or dopant-implanted) region, whereas the other one may be an undoped region. The underlayer may be formed of at least one material selected from the group consisting of or including Ru, Pt, Pd, Au, Fe, Ni, Cr alloy, NiO, MgO, a combination thereof or the like. According to at least some example embodiments, the dopant may be at least one of He ions and Ga ions. The magnetic layer may include at least one of Fe, Co, Pt, a combination thereof, or the like.

At least one other example embodiment provides a method of manufacturing an information storage device including a current applying unit connected to a magnetic layer having a plurality of magnetic domains. According to at least this example embodiment, an underlayer may be formed on a substrate. A mask pattern may be formed on the underlayer. The mask pattern may have a plurality of grooves exposing the underlayer. A dopant may be implanted into the exposed underlayer. The mask pattern may be removed. A magnetic layer may be formed on the underlayer.

According to at least some example embodiments, the grooves may be formed using a nanoimprint method, a lithography method or the like. When using a nanoimprint method, a resin layer may be formed on the underlayer, and the resin layer may be imprinted using a master stamp having a plurality of downward protrusions. The master stamp may be removed, thereby forming the mask pattern on the underlayer. The underlayer may be formed of at least one material selected from the group consisting of or including Ru, Pt, Pd, Au, Fe, Ni, Cr alloy, NiO, MgO, a combination thereof or the like. The dopant may be at least one of He ions and Ga ions. The magnetic layer may include at least one of Fe, Co, Pt, a combination thereof, or the like.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
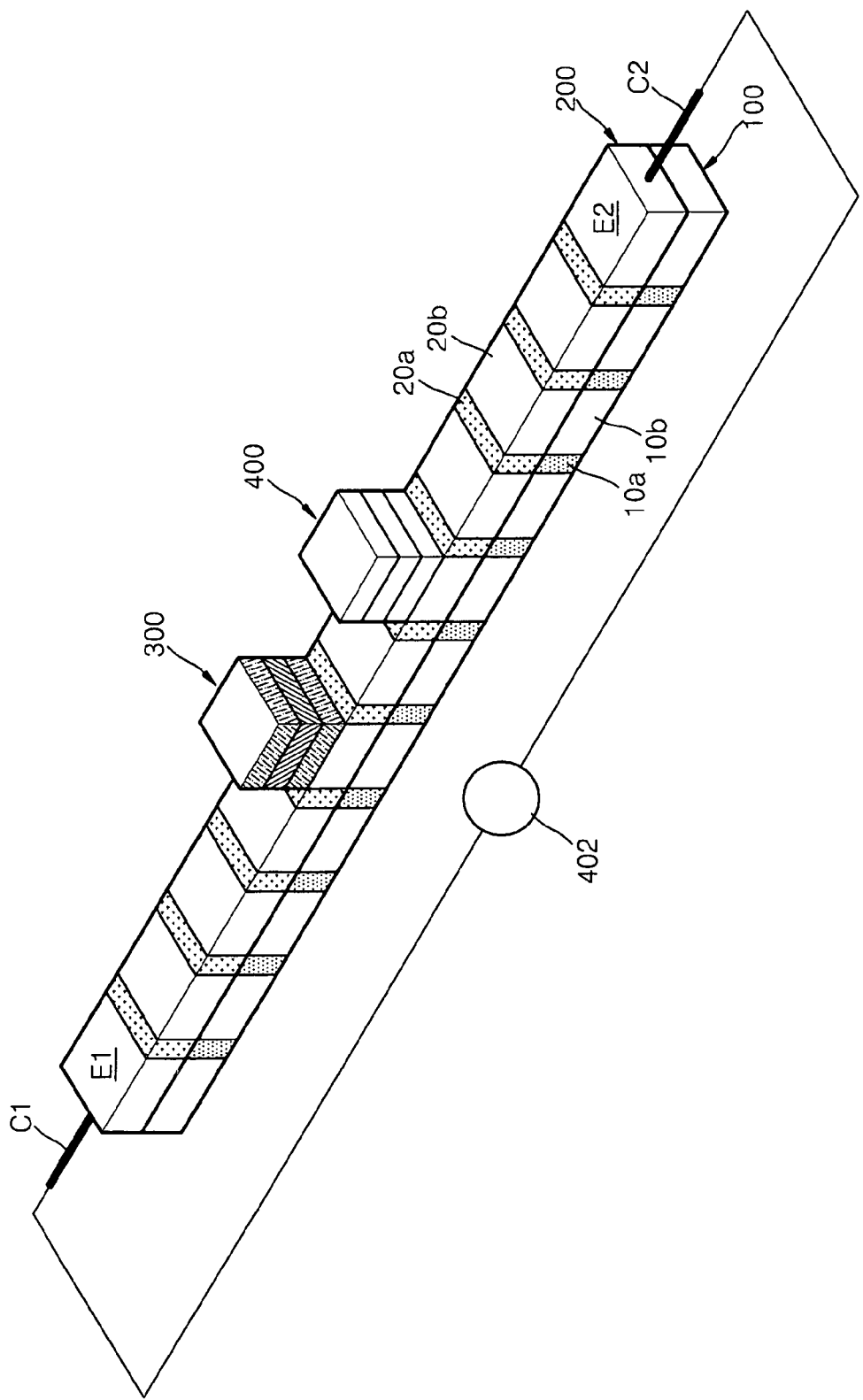
FIG. 1 is a perspective view of an information storage device using magnetic domain wall movement according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Moreover, It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be described in detail with reference to the attached drawings. In the description, the detailed descriptions of well-known functions and structures have been omitted so as not to hinder the understanding of the present invention.

Like reference numerals in the drawings denote like elements, and the sizes of elements in the drawings are exaggerated for clarity and explanatory conveniences.

FIG. 1 illustrates an information storage device using magnetic domain wall movement according to an example embodiment.

Referring to FIG. 1, an information storage device may include a magnetic layer 200 formed on an underlayer 100. The underlayer 100 may serve as a seed layer for forming the magnetic layer 200. For example, the underlayer 100 may be a layer formed of at least one material selected from the group consisting of or including Ru, Pt, Pd, Au, Fe, Ni, Cr alloy, NiO, MgO, a combination thereof, or the like. The underlayer 100 may have at least one first region 10a and at least one second region 10b. As shown in FIG. 1, for example, the underlayer 100 may include a plurality of first regions 10a and a plurality of second regions 10b. The plurality of first regions 10a and second regions 10b may be alternately disposed. According to example embodiments, the crystalline characteristics of the first and second regions 10a and 10b may be different from each other. For example, the first region 10a and the second region 10b may have different lattice parameters and/or different surface morphologies. Although information storage devices according to example embodiments may include a plurality of first regions 10a and a plurality of second regions 10b, in some instances, example embodiments will be described with regard to a first region 10a and a second region 10b for the sake of clarity.

A difference between the crystalline characteristics of the first and second regions 10a and 10b may be based on the difference between their doping states. For example, when the first region 10a is a region in which a dopant is implanted, the second region 10b may be an undoped region. This difference may result in different crystalline characteristics between the two regions. In a more specific example, when Ga or He ions are implanted into a region (e.g., first region 10a) of a Ru layer (e.g., the underlayer 100) having a hexagonal close-packed (HCP) structure, the ion-implanted region may have a larger lattice parameter than another region (e.g., second region 10b) into which ions are not implanted.

The magnetic layer 200 may be a storage track including a plurality of magnetic domains. A magnetic domain wall may be arranged between each of the magnetic domains. Information may be stored in the magnetic domains. The magnetic layer 200 may be formed of a material including at least one of Fe, Co, Pt, an alloy thereof, or the like. For example, the magnetic layer 200 may be formed of a material selected from the group consisting of or including, FePt, FePd, CoCr, CoCu, CoPt, CoTb, CoCrPt, CoFeTb, CoFeGd, CoFeNi, or the like.

The magnetic layer 200 may include at least one third region 20a and at least one fourth region 20b. For example, the magnetic layer 200 may include a plurality of third regions 20a and a plurality of fourth regions 20b. The plurality of third regions 20a and the plurality of fourth regions 20b may be alternately arranged. Each third region 20a may be arranged on a first region 10a and each fourth region 20b may be arranged on a second region 10b. The third and fourth regions 20a and 20b may have different magnetic anisotropic energy constants.

According to at least one example embodiment, the third and fourth regions 20a and 20b may have magnetic anisotropic energy constants of a general ferromagnetic substance, for example, magnetic anisotropic energy constants of between about $10^5$ erg/cc and about $10^7$ erg/cc, inclusive. A difference between the magnetic anisotropic energy constants of the third and fourth regions 20a and 20b may be at least several erg/cc or more. The differences in magnetic anisotropic energy constants may result from the differences between the first region 10a and the second region 10b on which the third and fourth regions 20a and 20b are formed. For example, the underlayer 100 may affect the crystalline orientation and magnetic characteristic of the magnetic layer 200 so that the magnetic anisotropic energy constants of the third region 20a formed on the first region 10a and the fourth region 20b formed on the second region 10b may be different from each other.

Because the energy of a magnetic domain wall is proportional to the square of a magnetic anisotropic energy constant, the magnetic domain wall may have a more stable energy state in a region in which a magnetic anisotropic energy constant is relatively low. Thus, when the third region 20a has a smaller magnetic anisotropic energy constant than the fourth region 20b, the magnetic domain wall may have a more stable energy state in the third region 20a than in the fourth region 20b. In this example, the magnetic domain wall that begins moving in response to a pulse current applied to the magnetic layer 200, may pass the fourth region 20b, and then be pinned in the third region 20a. Accordingly, the third region 20a may be a pinning site of the magnetic domain wall.

A difference in magnetic anisotropic energy constant between the third region 20a and the fourth region 20b may be relatively large. But, even when the difference in magnetic anisotropic energy constant between the third region 20a and the fourth region 20b is relatively small (e.g., about several erg/cc), the magnetic domain wall may still be pinned more easily in the third region 20a having the smaller magnetic anisotropic energy constant.

Still referring to FIG. 1, first and second conductive lines C1 and C2 may be connected to ends E1 and E2 of the magnetic layer 200, respectively. Each of the first and second conductive lines C1 and C2 may be connected to a driving element or currently applying unit 402 such as a transistor, a diode or the like. A given energy for magnetic domain wall movement, (e.g., a current) may be applied to the magnetic layer 200 through the first and second conductive lines C1 and C2. The direction of a magnetic domain wall movement may be determined according to the direction of the current flow. Because the magnetic domain wall moves in the direction of electron movement, the direction of magnetic domain wall movement is opposite to the direction of the current flow.

Although discussed herein as being connected to ends E1 and E2 of the magnetic layer 200, positions of the first and second conductive lines C1 and C2 may be changed. For example, the first and second conductive lines C1 and C2 may be connected to respective ends of the underlayer 100 instead of the magnetic layer 200.

Still referring to FIG. 1, a read unit 300 for data reproduction and a write unit 400 for data recording may be arranged on or near a region of the magnetic layer 200. The read unit 300 may be, for example, a giant magneto resistance (GMR) sensor using a GMR effect or a tunnel magneto resistance (TMR) sensor using a TMR effect. The GMR sensor and the TMR sensor are well-known, and thus, a detailed description thereof will be omitted. The read unit 300 is not limited to the GMR and TMR sensors and other devices may be used.

The write unit 400 may be a GMR or TMR write unit using a spin torque phenomenon of electrons or a unit for performing a write operation using an external magnetic field. When the write unit 400 uses an external magnetic field, the write unit may be spaced apart from the magnetic layer 200 by a given distance. The structure and principle of the write unit 400 is not limited to the above description, but may be changed. In addition, instead of separate read and write units 300 and 400, a unitary read/write unit for performing both a write operation and a read operation may be provided. Although not shown, a capping layer for covering the read unit 300 and the write unit 400 may be formed on the magnetic layer 200.

In example operation, the magnetic domain wall may move one bit unit in response to a pulse current applied to the magnetic layer 200 through the first and second conductive lines C1 and C2. Data may be written in the magnetic layer 200 by applying a write current to the write unit 400. Data written in the magnetic layer 200 may be reproduced or read by applying a read current to the read unit 300.

Because the third region 20a having a smaller a magnetic anisotropic energy constant at pinning sites of the magnetic domain wall, the magnetic domain wall may be moved by a bit unit more precisely, and data written in the magnetic layer 200 may be retained more stably.

FIGS. 2A through 2E are cross-sectional views for illustrating a method of manufacturing information storage devices according to an example embodiment.

Figure 2A:
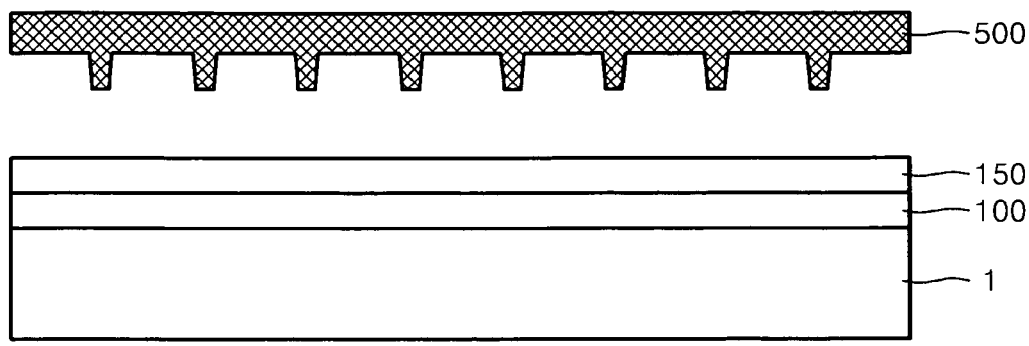
FIGS. 2A through 2E are cross-sectional views for illustrating a method of manufacturing information storage devices according to an example embodiment.

Referring to FIG. 2A, an underlayer 100 may be formed on a substrate 1. A resin layer 150 may be formed on the underlayer 100. The underlayer 100 may be formed of at least one material selected from the group consisting of or including Ru, Pt, Pd, Au, Fe, Ni, Cr alloy, NiO, MgO, a combination thereof, or the like. According to at least one example embodiment, the underlayer 100 may be formed of a Ru material. A master stamp 500 may be positioned on or over the resin layer 150. The master stamp 500 may have a plurality of downward protrusions. Each downward protrusion may extend vertically downward a given distance. The given distance may be less than or equal to the thickness of a resin layer 150. The width of each downward protrusion may be between about 2 nm and about 250 nm, inclusive. The master stamp 500 may be manufactured using a fine patterning method such as E-beam lithography or the like.

Figure 2B:
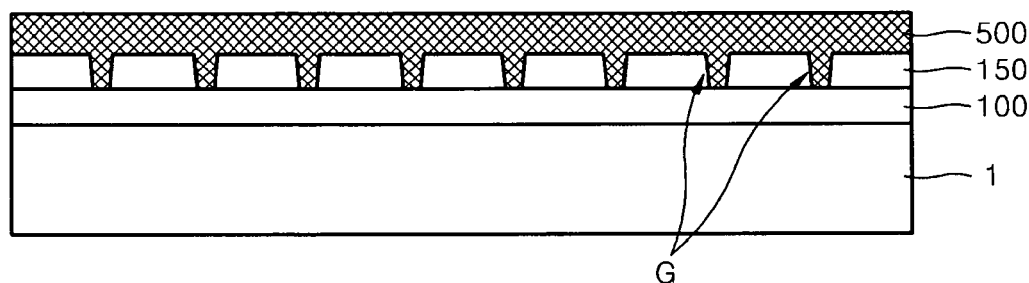

Referring to FIG. 2B, the resin layer 150 may be imprinted using the master stamp 500 to form a plurality of grooves. The resin layer 150 may be patterned to a nanoscale. A distance between the grooves G may be between about 5 nm and about 1000 nm, inclusive. A width of the grooves may be between about 2 nm and about 250 nm, inclusive.

Figure 2C:
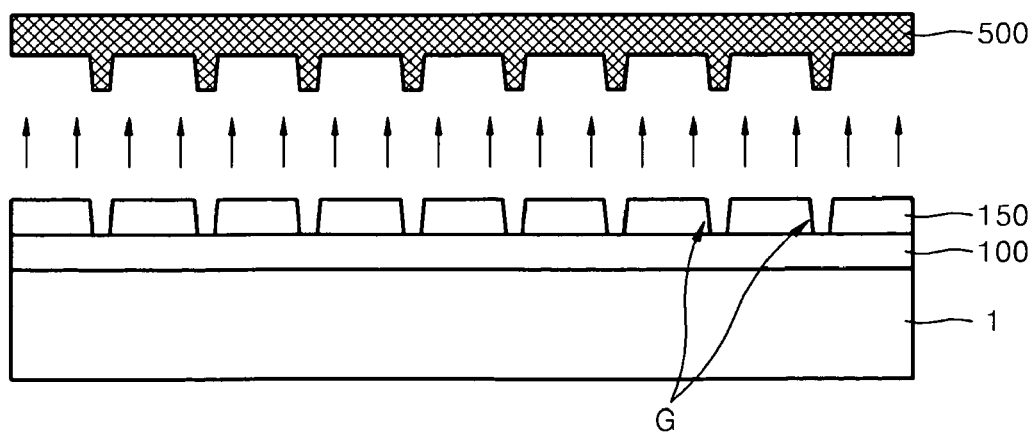

Referring to FIG. 2C, the master stamp 500 may be separated from the resin layer 150. When the master stamp 500 is separated from the resin layer 150, a portion of the resin layer 150 may remain on a bottom surface of the grooves G. In this example, the remaining portion of the resin layer 150 on the bottom surface of the grooves G may be removed using, for example, plasma ashing or the like. The manufactured master stamp 500 may be re-used several times. The nanoimprint according to at least this example embodiment is relatively simple, relatively economical, and thus, more appropriate for mass production.

In FIGS. 2A through 2C, the grooves G may be formed using a nanoimprint method, but may also be formed using other methods. For example, after forming a hard mask layer (e.g., a silicon oxide and/or silicon nitride layer) on the resin layer 150 of FIG. 2A, the grooves G may be formed by etching the hard mask layer and the resin layer 150 using E-beam lithography, lithography using interference of ultraviolet rays, laser, nano-sphere lithography using nanoparticles, or a similar process.

Figure 2D:
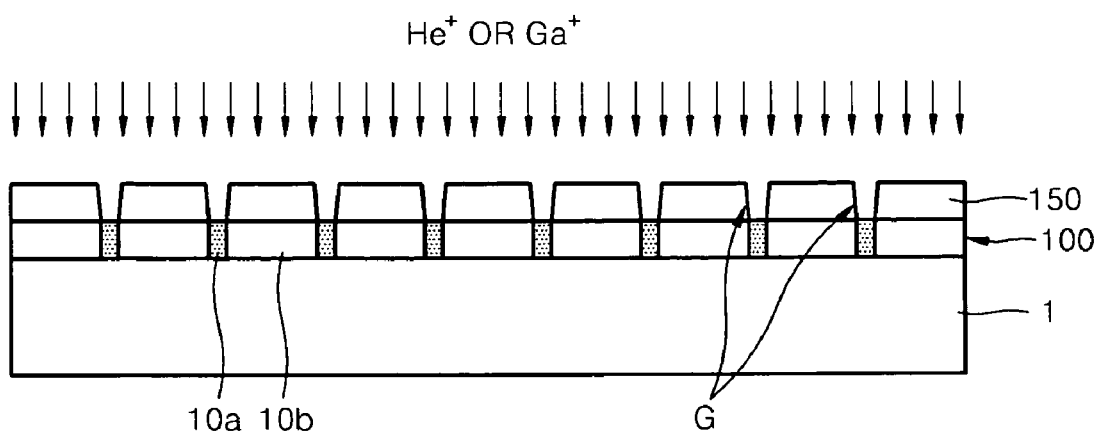

Referring to FIG. 2D, dopant ions such as He and/or Ga ions may be implanted/doped into the exposed underlayer 100. When doping the exposed underlayer 100, the resin layer 150 having grooves G serves as an ion implantation mask. As a result, doped first regions 10a may be formed in underlayer 100. The doped region 10a may be equivalent to the first region 10a described above with regard to FIG. 1. The other regions excluding the first regions 10a correspond to the second regions 10b described above with reference to FIG. 1.

Figure 2E:
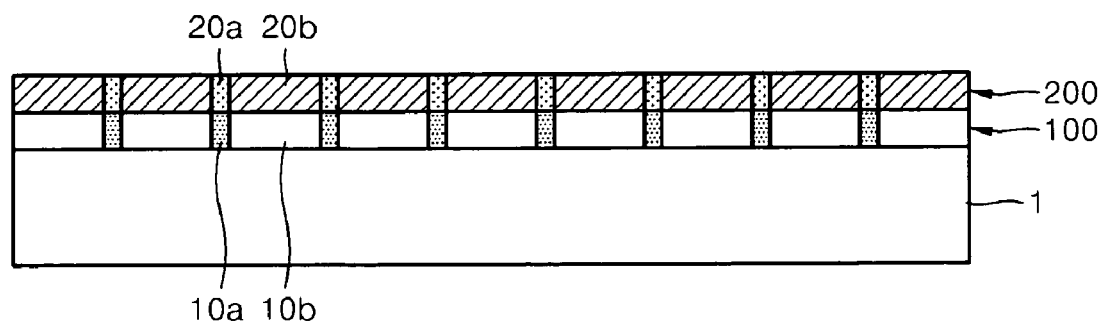

As illustrated in FIG. 2E, after removing the resin layer 150, a magnetic layer 200 may be formed on the underlayer 100. The magnetic layer 200 may be formed of a material including at least one of Fe, Co, Pt, an alloy thereof or the like. For example, the magnetic layer 200 may be formed of a material selected from the group consisting of or including FePt, FePd, CoCr, CoCu, CoPt, CoTb, CoCrPt, CoFeTb, CoFeGd, CoFeNi, or the like.

The magnetic layer 200 may include a third region 20a formed on each first regions 10a and a fourth region 20b formed on each second region 10b. Because the first region 10a and the second region 10b have different crystallinity characteristics, the third region 20a and the fourth region 20b may have different magnetic anisotropic energy constants. The third and fourth regions 20a and 20b may have magnetic anisotropic energy constants of a general ferromagnetic substance. For example, the third and fourth regions 20a and 20b may have magnetic anisotropic energy constants of between about $10^5$ erg/cc and about $10^7$ erg/cc, inclusive. A difference between the magnetic anisotropic energy constants of the third and fourth regions 20a and 20b may be at least several erg/cc or more. As described previously, the third region 20a may be a pinning site of a magnetic domain wall.

The current applying unit 402 may be connected to the magnetic layer 200 and a write unit and/or a read unit may be formed on a region of the magnetic layer 200. A capping layer covering the write unit and the read unit may be formed on the magnetic layer 200.

As described above, according to at least this example embodiment, the pinning site of the magnetic domain wall may be formed within the magnetic layer 200 using a nanoimprint and ion implantation processes, which may suppress and/or prevent geometric deformation of the magnetic layer 200. Relatively fine and/or relatively uniform pinning sites may be formed more easily in the magnetic layer 200 using example embodiments. Thus, example embodiments may improve recording density and/or reliability of information storage devices using magnetic domain wall movement.

According to at least one example embodiment, dopant may not be doped/implanted into the magnetic layer 200, which may suppress deterioration of the magnetic layer 200.

While the present invention has been particularly shown and described with reference to example embodiments thereof, it will be understood by one of ordinary skill in the art that various changes in form and details may be made therein without departing from the spirit and scope of the present invention as defined by the appended claims.

For example, it will be understood by one of ordinary skill in the art that the structure of the underlayer 100 and the magnetic layer 200 in information storage devices according to example embodiments may be modified in various shapes and other methods for making different crystalline characteristics of the first regions 10a and/or the second regions 10b than ion implantation may also be used.

Further, it will be understood by one of ordinary skill in the art that example embodiments may be applied to other devices using magnetic domain wall movement as well as the information storage device of FIG. 1. Therefore, the scope of the present invention is defined not by the detailed description of the invention but by the appended claims, and all differences within the scope will be construed as being included in the present invention.

What is claimed is:

1. An information storage device comprising:
   an underlayer including at least one first region and at least one second region, the first and second regions having different crystallinity characteristics;
   a magnetic layer arranged on the underlayer including a different material than the underlayer, the magnetic layer including at least one third region formed on the at least one first region and at least one fourth region formed on the at least one second region, the third and fourth regions having different magnetic anisotropic energy constants; and
   a current applying unit electrically connected to the magnetic layer, the current applying unit configured to apply a current to at least one of the underlayer and the magnetic layer.

2. The information storage device of claim 1, further comprising:
   a reading unit arranged on the magnetic layer; and
   a writing unit arranged on the magnetic layer.

3. The information storage device of claim 1, wherein one of the at least one first regions and the at least one second regions is a doped region and the other of the at least one first regions and the at least one second regions is an undoped region.

4. The information storage device of claim 3, wherein the doped region is doped with at least one of He and Ga ions.

5. The information storage device of claim 1, wherein the underlayer is formed of at least one material selected from the group consisting of Ru, Pt, Pd, Au, Fe, Ni, Cr alloy, NiO and MgO.

6. The information storage device of claim 1, wherein the magnetic layer includes at least one of Fe, Co, and Pt.

7. An information storage device, comprising:
   an underlayer including at least one first region and at least one second region, the first and second regions having different crystallinity characteristics; and
   a substantially undoped magnetic layer arranged on the underlayer including a different material than the underlayer, the magnetic layer including at least one third region formed on the at least one first region and at least one fourth region formed on the at least one second region, the third and fourth regions having different magnetic anisotropic energy constants.

8. The information storage device of claim 1, wherein the difference in magnetic anisotropic energy constants of the third and fourth regions is based on the different crystallinity characteristics of the first and second regions.

9. The information storage device of claim 1, wherein the information storage device is configured to move at least one magnetic domain wall through the magnetic layer.

10. The information storage device of claim 7, wherein the difference in magnetic anisotropic energy constants of the third and fourth regions is based on the different crystallinity characteristics of the first and second regions.

11. The information storage device of claim 7, wherein one of the at least one first regions and the at least one second regions is a doped region and the other of the at least one first regions and the at least one second regions is an undoped region.

12. The information storage device of claim 11, wherein the difference in magnetic anisotropic energy constants of the third and fourth regions is a function of a dopant concentration difference between the first and second regions.

13. The information storage device of claim 7, wherein the magnetic layer is a separate layer from the underlayer.

* * * * *